United States Patent
Takemura

(10) Patent No.: US 8,593,857 B2
(45) Date of Patent: Nov. 26, 2013

(54) SEMICONDUCTOR MEMORY DEVICE, DRIVING METHOD THEREOF, AND METHOD FOR MANUFACTURING SEMICONDUCTOR DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 125 days.

(21) Appl. No.: 13/024,401

(22) Filed: Feb. 10, 2011

(65) Prior Publication Data

US 2011/0205774 A1    Aug. 25, 2011

(30) Foreign Application Priority Data

Feb. 19, 2010  (JP) ................................ 2010-034903

(51) Int. Cl.
  *G11C 11/24*    (2006.01)
(52) U.S. Cl.
  USPC ........................................... 365/149; 257/296
(58) Field of Classification Search
  USPC ................... 365/149 O, 149; 257/296 X, 296
  See application file for complete search history.

(56) References Cited

U.S. PATENT DOCUMENTS

| | | | |
|---|---|---|---|
| 4,466,081 A | | 8/1984 | Masuoka |
| 5,220,530 A | * | 6/1993 | Itoh ........................ 365/189.14 |
| 5,349,366 A | | 9/1994 | Yamazaki et al. |
| 5,731,856 A | | 3/1998 | Kim et al. |
| 5,744,864 A | | 4/1998 | Cillessen et al. |
| 5,940,705 A | | 8/1999 | Lee et al. |
| 6,127,702 A | | 10/2000 | Yamazaki et al. |
| 6,294,274 B1 | | 9/2001 | Kawazoe et al. |
| 6,314,017 B1 | * | 11/2001 | Emori et al. .................. 365/149 |
| 6,445,026 B1 | * | 9/2002 | Kubota et al. ................. 257/296 |
| 6,563,174 B2 | | 5/2003 | Kawasaki et al. |
| 6,727,522 B1 | | 4/2004 | Kawasaki et al. |
| 7,049,190 B2 | | 5/2006 | Takeda et al. |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

(Continued)

*Primary Examiner* — Vanthu Nguyen
(74) *Attorney, Agent, or Firm* — Fish & Richardson P.C.

(57) ABSTRACT

A matrix is formed using a plurality of memory cells in each of which a drain of the writing transistor is connected to a gate of a reading transistor and one electrode of a capacitor. A gate of the writing transistor, a source of the writing transistor, a source of the reading transistor, and a drain of the reading transistor are connected to a writing word line, a writing bit line, a reading bit line, and a bias line, respectively. The other electrode of the capacitor is connected to a reading word line. In order to decrease the number of wirings, the writing bit line is substituted for the reading bit line. The reading bit line is formed so as to be embedded in a groove-like opening formed over a substrate.

25 Claims, 16 Drawing Sheets

(56) References Cited

U.S. PATENT DOCUMENTS

| | | | |
|---|---|---|---|
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,009,459 | B2 * | 8/2011 | Wu et al. .................. 365/149 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0002590 | A1 | 1/2009 | Kimura |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0097838 | A1 | 4/2010 | Tanaka et al. |
| 2010/0109002 | A1 | 5/2010 | Itagaki et al. |
| 2010/0148171 | A1 | 6/2010 | Hayashi et al. |
| 2010/0193785 | A1 | 8/2010 | Kimura |
| 2011/0182110 | A1 * | 7/2011 | Yamazaki et al. ............ 365/149 |

FOREIGN PATENT DOCUMENTS

| | | |
|---|---|---|
| JP | 56162875 A | 12/1981 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001053164 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008262962 A | 10/2008 |
| WO | 2004/114391 A1 | 12/2004 |

OTHER PUBLICATIONS

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Ishii. T. et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810, in English.

International Search Report (Application No. PCT/JP2011/051846) dated Apr. 26, 2011, in English.

Written Opinion (Application No. PCT/JP2011/051846) dated Apr. 26, 2011, in English.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for Amoled Back-Plane," SID Digest '09: SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," Am-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," Am-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda, T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of Am-OLED," IDW '06: Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display,"Am-FPD '09 Digest of Technical Papers, Jul. 1, 2009, pp. 227-230, The Japan Society of Applied Physics.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," Am-FPD'09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide.Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission Am-Oled Display," SID Digest '08: SID International Symposium Digest of Technical Papers, May 20, 2008, vol. 39, pp. 629-632.

Park, J et al., "Amorphous Indium-Gallium-Zinc Oxide TFTS and Their Application for Large Size Amoled, " Am-FPD '08 Digest of Technical Papers, Jul. 2, 2008, pp. 275-278.

Park, S et al., "Challenge to Future Displays: Transparent Am-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous Gizo (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR MEMORY DEVICE, DRIVING METHOD THEREOF, AND METHOD FOR MANUFACTURING SEMICONDUCTOR DEVICE

TECHNICAL FIELD

The present invention relates to a memory device using a semiconductor.

BACKGROUND ART

There are many kinds of memory devices using semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) in a certain cycle (generally several tens of milliseconds).

In an SRAM, data is held by utilizing a bistable state of a flip-flop circuit. Although a CMOS inverter is generally used in a flip-flop circuit of an SRAM, since six transistors are used in one memory cell, an integration degree of the SRAM is lower than that of a DRAM. In addition, the data is lost when power is not supplied.

On the other hand, in an EEPROM or a flash memory, a so-called floating gate is provided between a channel and a gate and charge is stored in the floating gate, whereby data is held. The charge stored in the floating gate is held even after power supply to a transistor stops, which is why these memories are called non-volatile memories. For example, Patent Document 1 may be referred to for a flash memory.

In this specification, a memory having a floating gate, examples of which are an EEPROM and a flash memory, is called a floating gate non-volatile memory (FGNVM). Since data at some stages (multivalued data) can be stored in one memory cell in an FGNVM, storage capacity can be large. Further, since the number of contact holes can be significantly decreased in a NAND-type flash memory, an integration degree can be increased to some extent.

However, in a conventional FGNVM, high voltage is needed at the time of injection of charge to a floating gate or removal of the charge. Because of this, deterioration of a gate insulating film cannot be avoided and it is not possible to limitlessly repeat writing and erasing operations. Further, by application of high voltage, interference between adjacent memory cells occurs at an integration degree above a certain level; therefore, a certain distance needs to be kept between memory cells.

REFERENCE

Patent Document

[Patent Document 1] Japanese Published Patent Application No. S57-105889

DISCLOSURE OF INVENTION

As described above, a conventional semiconductor memory device has good points and bad points and there has been no semiconductor devices meeting all necessary conditions. In a memory device, the first priority is lower power consumption. When the power consumption is high, the size of a device for supplying power needs to be larger, or an operating time on a battery is shortened. Moreover, a semiconductor element may be heated; thus, the characteristics of the element may be deteriorated, and in some cases, a circuit is damaged. In addition, there is preferably no limitation on the number of rewriting times and it is desirable that rewriting can be performed one billion times or more. Needless to say, a high integration degree is also needed.

In light of these points, a DRAM has difficulty in reducing power consumption because leakage current is generated and refreshing is performed all the time. In contrast, in an SRAM, although a problem of power consumption can be solved to some extent, there is another problem in that the integration degree cannot be increased because six transistors are included in one memory cell. Moreover, in an FGNVM, although the power consumption and the integration degree are not problematic, the number of rewriting times is a hundred thousand or less.

In view of the above, it is the first object of an embodiment of the present invention to achieve the following three conditions: power consumed by a memory cell for holding memory is lower than that in a DRAM; the number of transistors used in a memory cell is five or less; and the number of rewriting times is one million or more. Further, it is the second object to achieve the following two conditions: data is held without power supply for 10 hours or longer, preferably 100 hours or longer; and the number of rewriting times is one million or more. Note that in this specification, a data holding time is a time needed for the amount of charge held in a memory cell to be decreased to 90% of the initial amount.

In an embodiment of the present invention, in addition to the above objects, it is another object to provide a novel semiconductor device, specifically a novel semiconductor memory device. It is another object to provide a driving method of a novel semiconductor device, specifically a novel semiconductor memory device. Further, it is another object to provide a manufacturing method of a novel semiconductor device, specifically a novel semiconductor memory device. The present invention achieves at least one of the above-described objects.

Terms used in this specification are briefly described. In this specification, when one of a source and a drain of a transistor is called a source, the other is called a drain for convenience, but they are not particularly distinguished. Therefore, a source in this specification can be alternatively referred to as a drain.

In the first structure of the present invention, one memory cell includes a transistor as a writing transistor, in which leakage current between a source and a drain in an off state is low, another transistor (a reading transistor), and a capacitor. Further, as wirings connected to these, five kinds of wirings that are a writing word line, a writing bit line, a reading word line, a reading bit line, and a bias line are prepared.

The drain of the writing transistor is connected to a gate of the reading transistor and one electrode of the capacitor. Further, a gate of the writing transistor is connected to the writing word line; the source of the writing transistor is connected to the writing bit line; a source of the reading transistor is connected to the reading bit line; a drain of the reading transistor is connected to the bias line; and the other electrode of the capacitor is connected to the reading word line.

In the writing transistor in an off state (in the case of an n-channel transistor, a state where the potential of the gate is lower than the potential of the source and the drain), leakage current between the source and the drain is $1\times10^{-20}$ A or lower, preferably $1\times10^{-24}$ A or lower at a temperature when the transistor is in use (e.g., 25° C.), or $1\times10^{-20}$ A or lower at 85° C. In the case of a general silicon semiconductor, it is difficult to realize leakage current having such a small value; however, in a transistor obtained by processing an oxide semiconductor in a preferable condition, such a value can be achieved. Therefore, an oxide semiconductor is preferably used for the writing transistor. Needless to say, if leakage current can be made to have a value smaller than or equal to the above-described value by another method with the use of a silicon semiconductor or other kinds of semiconductors, the use of such semiconductors is not precluded.

Although a variety of known materials can be used as the oxide semiconductor, a material with a band gap of 3 electron volts or more, preferably greater than or equal to 3 electron volts and less than 3.6 electron volts is desirable. In addition, it is desirable to use a material whose electron affinity is 4 electron volts or more, further preferably greater than or equal to 4 electron volts and less than 4.9 electron volts. Among such materials, one whose carrier concentration is less than $1\times10^{14}$ cm$^{-3}$, preferably less than $1\times10^{11}$ cm$^{-3}$ is desirable.

As for the reading transistor, although there is no limitation on leakage current between the source and the drain in an off state, it is desirable to use a transistor which operates at high speed in order to increase the reading rate. It is preferable to use a transistor with switching speed of 10 nanoseconds or less. Further, in both the writing transistor and the reading transistor, gate leakage current (leakage current between the gate and the source or between the gate and the drain) needs to be extremely low; also in the capacitor, internal leakage current (leakage current between the electrodes) needs to be low. Each of the leakage current is preferably $1\times10^{-20}$ A or lower, further preferably $1\times10^{-24}$ A or lower at a temperature when the transistor or capacitor is in use (e.g., 25° C.).

Voltage applied to the gate of the reading transistor is changed depending on voltage of the reading word line and is proportional to (capacitance of the capacitor)/(gate capacitance of the reading transistor+capacitance of the capacitor). Therefore, when the capacitance of the capacitor is larger than the gate capacitance of the reading transistor, appropriate voltage can be applied to the gate of the reading transistor without changing the voltage of the reading word line so much. On the other hand, when the capacitance of the capacitor is smaller than the gate capacitance, the voltage of the reading word line needs to be considerably changed in order that voltage close to the appropriate voltage be applied to the gate of the reading transistor.

Therefore, the capacitance of the capacitor is preferably larger than or equal to the gate capacitance of the reading transistor, further preferably larger than or equal to 2 times as large as the gate capacitance of the reading transistor. The capacitance of the capacitor is preferably 10 fF or smaller so that the semiconductor memory device operates at high speed.

The writing word line, the writing bit line, the reading bit line, the bias line, and the reading word line are arranged in a matrix; the writing word line is preferably orthogonal to the writing bit line and the reading bit line is preferably parallel to the bias line so that matrix drive is performed. In addition, the writing word line is preferably parallel to the reading word line.

An example of a memory cell having the above-described structure is illustrated in FIG. 1A. Here, a memory cell in the n-th row and the m-th column is described. In FIG. 1A, a memory cell including a writing transistor Tr1(n,m), a reading transistor Tr2(n,m), and a capacitor C(n,m) is illustrated.

Here, a drain of the writing transistor Tr1(n,m) is connected to a gate of the reading transistor Tr2(n,m) and one electrode of the capacitor C(n,m).

Further, a gate of the writing transistor Tr1(n,m) is connected to a writing word line Qn; a source of the writing transistor Tr1(n,m) is connected to a writing bit line Rm; a source of the reading transistor Tr2(n,m) is connected to a reading bit line Om; a drain of the reading transistor Tr2(n,m) is connected to a bias line Sm; and the other electrode of the capacitor C(n,m) is connected to a reading word line Pn.

In FIG. 1A, the writing word line Qn is parallel to the reading word line Pn and the writing bit line Rm, the reading bit line Om, and the bias line Sm are parallel to one another. Further, the writing word line Qn and the reading word line Pn are orthogonal to the writing bit line Rm, the reading bit line Om, and the bias line Sm.

In FIG. 1B, the memory cell in the n-th row and the m-th column and a portion around the memory cell are illustrated. As apparent from the diagram, two wirings per row and three wirings per column are necessary; thus, (2N+3M) wirings are necessary in a matrix of N rows and M columns.

In order that data be written in the memory cell illustrated in FIG. 1A, the writing transistor Tr1(n,m) is turned on by applying appropriate potential to the writing word line Qn. By the potential of the writing bit line Rm at this time, charge is injected to the drain side of the writing transistor Tr1(n,m). The amount of the charge injected at this time is determined depending on the potential of the writing bit line Rm, the gate capacitance of the reading transistor Tr2(n,m), the capacitance of the capacitor C(n,m), and the like and the result is thus always almost the same in the case where the conditions are the same, and a variation is small. In this manner, data is written.

Then, by applying different appropriate potential to the writing word line Qn, the writing transistor Tr1(n,m) is turned off. Current which flows between the source and the drain of the writing transistor Tr1(n,m) in an off state is $1\times10^{-20}$ A or lower, whereby charge on the drain side of the writing transistor Tr1(n,m) is held as it is for an extremely long time.

When the data is read, appropriate potential is applied to the reading word line Pn and a state of the reading transistor Tr2(n,m) is monitored. For example, the following two states are considered as data: a state where there is no charge on the drain side of the writing transistor Tr1(n,m); and a state where there is positive charge on the drain side of the writing transistor Tr1(n,m).

It is also assumed that the reading transistor Tr2(n,m) is an n-channel transistor; the bias line Sm is held at appropriate positive potential; and appropriate potential lower than or equal to the threshold value of the reading transistor Tr2(n,m) is applied to the reading word line Pn.

In the state where there is no charge, since the potential of the gate of the reading transistor Tr2(n,m) is lower than or equal to the threshold value, the reading transistor Tr2(n,m) is in an off state. Thus, resistance between the source and the drain is extremely high. Therefore, the potential of the reading bit line Om is largely different from the potential of the bias line Sm. However, when there is positive charge on the drain side of the writing transistor Tr1(n,m), the reading transistor Tr2(n,m) can be turned on in some cases even when the potential of the reading word line Pn does not reach the threshold value; accordingly, the potential of the reading bit line Om is the same as or extremely close to the potential of the bias line Sm in some cases. In this manner, what data is held can be known.

With the use of the same principle, a stage to which the amount of the charge stored in one memory cell corresponds can be known. A circuit at the time of reading is equivalently illustrated in FIG. 4A. By changing the potential of the writing bit line Rm at the time of writing, a value of charge Q is at four stages (Q0, Q1, Q2, and Q3, where Q0<Q1<Q2<Q3). At the time of reading, the writing transistor Tr1($n,m$) can be regarded as an insulator and thus is omitted together with the writing word line Qn and the writing bit line Rm from the diagram.

In accordance with the value of the charge Q, apparent characteristics of the reading transistor Tr2($n,m$) are changed. When the potential of the reading bit line Om is 0, the potential of the bias line Sm is $V_{SH}$(>0), and the potential of the reading word line Pn is changed, the amount of current flowing in the reading transistor Tr2($n,m$) is changed. The state is illustrated in FIG. 4B.

In the case where the largest amount of charge is held (Q=Q3), even when $V_g$ is negative, a sufficiently large amount of current flows and the reading transistor Tr2 is turned on. For example, the reading transistor Tr2 is turned on when $V_g=V_{P1}$. In order to turn the reading transistor Tr2 off, $V_g$ needs to be a sufficiently large negative value (e.g., $V_{PL}$). The second curve from the left shows a case where the amount of charge is the second largest (Q=Q2). At this time, the reading transistor Tr2 is in an off state when $V_g=V_{P1}$. On the other hand, the reading transistor Tr2 is turned on when $V_g=V_{P2}$. In the case where the amount of charge is the third largest (Q=Q1), the reading transistor Tr2 is in an off state when $V_g=V_{P2}$; however, the reading transistor Tr2 is turned on when $V_g=V_{P3}$. In the case where Q=Q0, the reading transistor Tr2 is in an off state even when $V_g=V_{P3}$.

That is, by applying potential at some levels to the reading word line Pn, the amount of the charge held can be known. At first, $V_g=V_{PL}$. In this case, the reading transistor Tr2 is in an off state regardless of the amount of the charge held. Then, when $V_g=V_{P1}$, the reading transistor Tr2 is turned on only when the amount of the charge held is Q3. If the reading transistor Tr2 is turned on at this stage, it can be judged that the amount of the charge held is Q3.

When $V_g=V_{P2}$, the reading transistor Tr2 is turned on only when the amount of the charge held is Q3 or Q2. If the reading transistor Tr2 is turned on for the first time at this stage, it can be judged that the amount of the charge held is Q2.

When $V_g=V_{P3}$, the reading transistor Tr2 is turned on only when the amount of the charge held is Q3, Q2, or Q1. If the reading transistor Tr2 is turned on for the first time at this stage, it can be judged that the amount of the charge held is Q1. If the reading transistor Tr2 is not turned on even at this stage, it can be judged that the amount of the charge is Q0. In this manner, the data at four stages (2 bits) can be written and read. Needless to say, in a similar manner, much more data such as data at eight stages (3 bits) or data at 16 stages (4 bits) can be written and read.

As described above, in order that much data be stored by making the amount of the charge held in the memory cell be at a plurality of stages, it is necessary that a variation in the amount of the charge held is small. This is because when the variation in the amount of the charge is large, each gap between $V_{PL}$, $V_{P1}$, $V_{P2}$, and $V_{P3}$ in FIG. 4B needs to be made larger. The matrix-type semiconductor memory device according to the first structure of the present invention is suitable for this purpose because a variation in the amount of the charge held is small.

In the second structure of the present invention, the writing bit line is substituted for the reading bit line in the above-described first structure of the present invention. A memory cell having such a structure is illustrated in FIG. 5A. Here, a memory cell in the n-th row and the m-th column is described as an example. In FIG. 5A, the memory cell including the writing transistor Tr1($n,m$), the reading transistor Tr2($n,m$), and the capacitor C(n,m) is illustrated. The drain of the writing transistor Tr1($n,m$) is connected to the gate of the reading transistor Tr2($n,m$) and one electrode of the capacitor C(n,m).

Further, the gate of the writing transistor Tr1($n,m$) is connected to the writing word line Qn; the source of the writing transistor Tr1($n,m$) is connected to the writing bit line Rm; the source of the reading transistor Tr2($n,m$) is also connected to the writing bit line Rm; the drain of the reading transistor Tr2($n,m$) is connected to the bias line Sm; and the other electrode of the capacitor C(n,m) is connected to the reading word line Pn.

In FIG. 5B, the memory cell in the n-th row and the m-th column and a portion around the memory cell are illustrated. As apparent from the diagram, two wirings per row and two wirings per column are necessary; thus, (2N+2M) wirings are necessary in a matrix of N rows and M columns. The writing bit line is substituted for the reading bit line of the first structure of the present invention, whereby the number of wirings can be made smaller than that of the first structure of the present invention.

In the third structure of the present invention, the bias line in the above-described second structure of the present invention also serves as a bias line in an adjacent column. Memory cells having such a structure are illustrated in FIG. 14A. Here, a memory cell in the n-th row and the (2$m$−1)-th column and a memory cell in the n-th row and the 2$m$-th column are described as an example. In FIG. 14A, a memory cell which includes a writing transistor Tr1($n,2m$−1), a reading transistor Tr2($n,2m$−1), and a capacitor C($n,2m$−1) and an adjacent memory cell which includes a writing transistor Tr1($n,2m$), a reading transistor Tr2($n,2m$), and a capacitor C($n,2m$) are illustrated.

A drain of the writing transistor Tr1($n,2m$−1) is connected to a gate of the reading transistor Tr2($n,2m$−1) and one electrode of the capacitor C($n,2m$−1); similarly, a drain of the writing transistor Tr1($n,2m$) is connected to a gate of the reading transistor Tr2($n,2m$) and one electrode of the capacitor C($n,2m$).

Further, a gate of the writing transistor Tr1($n,2m$−1) and a gate of the writing transistor Tr1($n,2m$) are connected to the writing word line Qn; a source of the writing transistor Tr1 ($n,2m$−1) and a source of the reading transistor Tr2($n,2m$−1) are connected to a writing bit line R2$m$−1; a source of the writing transistor Tr1($n,2m$) and a source of the reading transistor Tr2($n,2m$) are connected to a writing bit line R2$m$; a drain of the reading transistor Tr2($n,2m$−1) and a drain of the reading transistor Tr2($n,2m$) are connected to the bias line Sm; and the other electrode of the capacitor C($n,2m$−1) and the other electrode of the capacitor C($n,2m$) are connected to the reading word line Pn. That is, the memory cell in the n-th row and the (2$m$−1)-th column and the memory cell in the n-th row and the 2m-th column share the bias line Sm.

In FIG. 14B, the memory cell in the n-th row and the 2m-th column and a portion around the memory cell are illustrated. As apparent from the diagram, two wirings per row and three wirings per two columns are necessary; thus, (2N+3M) wirings are necessary in a matrix of N rows and 2M columns. In a matrix of the same scale, in the case of the first structure of the present invention, (2N+6M) wirings are necessary; in the case of the second structure of the present invention, (2N+4M) wirings are necessary. When the bias line in the second structure of the present invention also serves as the bias line in the adjacent column in the above-described manner, the number of wirings can be much smaller than that in the second structure of the present invention.

Although the three structures are described above as means for achieving the objects, a different solution is also disclosed in this specification. Further, the objects can be achieved also by making modifications obvious to those skilled in the art to the above three structures or any of the other means for achieving the objects which are disclosed in this specification. Therefore, means for achieving the objects are not limited to the above three structures.

By employing any of the above-described structures, at least one of the above-described objects can be achieved. In each of the above structures, since the writing operation is performed by ordinarily turning a transistor on or off, the problem of deterioration of an insulating film cannot occur. Therefore, the number of rewriting times in the above structures can be large. By optimizing conditions, even after performing rewriting a billion times, change in main characteristics of the transistor (threshold voltage, on state current, an S value, or the like) is in the range of measurement error or is only less than 1%.

FIG. 15 is a graph showing comparison of change in the threshold value of a reading transistor due to rewriting between a memory cell of a conventional FGNVM and a memory cell having the first structure of the present invention. In the memory cell of the FGNVM, when the number of rewriting times exceeds 1000, the threshold value obviously starts to change regardless of whether data "0" is written (i.e., an electron is not injected to the floating gate) or data "1" is written (i.e., an electron is injected to the floating gate). When the number of rewriting times is 10000, the difference between the threshold value when data "0" is written and the threshold value when data "1" is written is 3 volts or less. On the other hand, in the memory cell having the first structure of the present invention, no obvious change from the beginning can be seen even after rewriting is performed a billion times.

FIG. 16 is a graph showing comparison of change in the conductance of a transistor due to rewriting between a memory cell of a conventional FGNVM and a memory cell having the first structure of the present invention. In the memory cell of the FGNVM, when the number of rewriting times exceeds 100, the conductance obviously starts to decrease. When the number of rewriting times is 10000, the conductance is 20% or less of that of the beginning. This means that on resistance of the transistor is increased. In other words, response speed of the memory cell decreases as the number of rewriting times increases. On the other hand, in the memory cell having the first structure of the present invention, no obvious change from the beginning can be seen even after rewriting is performed a billion times. Thus, there is substantially no limit on the number of rewriting times in the semiconductor memory device according to an embodiment of the present invention.

An embodiment of the present invention also shows excellent characteristics related to a period during which data can be stored. Charge can be held for 10 hours or longer, preferably 100 hours or longer by making leakage current between the source and the drain of the transistor in an off state which is used, gate leakage current, and internal leakage current in the capacitor meet the above-described conditions. Moreover, by optimizing conditions, charge can be held for one month or longer, or one year or longer.

In the case where the charge is reduced due to the leakage current, refreshing may be performed similarly to a conventional DRAM; an interval between refreshing operations is determined depending on a period during which the charge can be held. In the case where the charge is held for such a long period as described above, refreshing is necessary, for example, only once a month or once a year. Frequent refreshing which is needed in a conventional DRAM is not necessary and thus power consumption of a semiconductor memory device is reduced.

Note that in a conventional DRAM, operation of writing data is needed again every time when the data is read; on the other hand, in a semiconductor memory device according to an embodiment of the present invention, such operation is unnecessary because data is not lost by operation of reading the data. Such a feature could be realized only in an SRAM; however, in the semiconductor memory device according to an embodiment of the present invention, the number of transistors used in one memory cell is five or less, typically 2, which is smaller than that in the case of a conventional SRAM. Furthermore, when one of the transistors is formed using an oxide semiconductor in a thin film shape, an increased integration degree can be obtained because the transistor can be stacked over a conventional silicon semiconductor.

In an embodiment of the present invention, an absolute value of necessary capacitance for a memory cell can be reduced; therefore, the integration degree can be increased. In a DRAM, for example, capacitance of at least 30 fF is needed because operation is interfered unless the capacitance of a memory cell is almost the same as or larger than the wiring capacitance. However, capacitance is proportional to the area. In the case where the integration degree is increased, the area of one memory cell decreases; thus, necessary capacitance cannot be secured. For this reason, a large capacitance needs to be obtained in a DRAM by employing a special shape or a special material.

On the other hand, the capacitance of the capacitor in an embodiment of the present invention can be determined by a relative proportion to the gate capacitance of the reading transistor. That is, as the integration degree is increased, the gate capacitance of the reading transistor is decreased; therefore, the capacitance necessary in the capacitor is also decreased in the same proportion. Therefore, even when the integration degree is increased, a capacitor having basically the same structure can be used.

Further, in a semiconductor memory device having the above-described structure, high voltage, which is needed for writing and erasing in an FGNVM, is not needed. Among FGNVMs, a so-called flash memory (especially a NAND-type flash memory) is superior to an SRAM and a DRAM in view of the integration degree; however, in order that data in even one memory cell be rewritten, data in a predetermined region needs to be collectively erased with the use of high voltage. In this respect, in the semiconductor memory device according to an embodiment of the present invention, writing (rewriting) is performed per row and thus completes through the minimum necessary operation.

Further, since charge is injected to the floating gate in one direction in a thermal non-equilibrium state in an FGNVM, a variation in the amount of charge is large. Data at a plurality of stages which depends on the amount of the charge held in the floating gate can be stored. However, when the variation in the amount of the charge is considered, data at around four stages (2 bits) is general. Higher voltage needs to be used in order that data of a larger number of bits be stored.

On the other hand, charge is reversibly injected in an embodiment of the present invention and thus a variation is small; for example, a variation in the threshold value of the reading transistor due to injection of charge can be 0.5 volts or smaller. Thus, data at more stages can be held in one memory cell within a narrower voltage range; consequently, voltage for writing or reading can be lower. For example, voltage used for writing or reading data of 4 bits (16 stages) can be 10 volts or lower.

Since voltage used is relatively low in an embodiment of the present invention, a phenomenon such as interference with an adjacent element or leakage of a signal to an adjacent element is less likely to occur than in an FGNVM.

In order to further increase such an effect of the present invention, an S value of a transistor used may be grater than or equal to 59 mV/dec and less than or equal to 70 mV/dec, preferably greater than or equal to 59 mV/dec and less than or equal to 63 mV/dec at a temperature when the transistor is in use. In this manner, a variation in threshold values in the whole semiconductor memory device can be reduced, which is a matter of course. In particular, when the writing transistor has an S value in the above range, a variation in the amount of charge at the time of writing data becomes small. In addition, when the reading transistor has an S value in the above range, the potential to be applied to the reading word line at the time of reading can be set with a short interval. These features are advantageous in the case of dealing with multivalued data in a semiconductor memory device.

BEST MODE FOR CARRYING OUT THE INVENTION

Figure 1A:
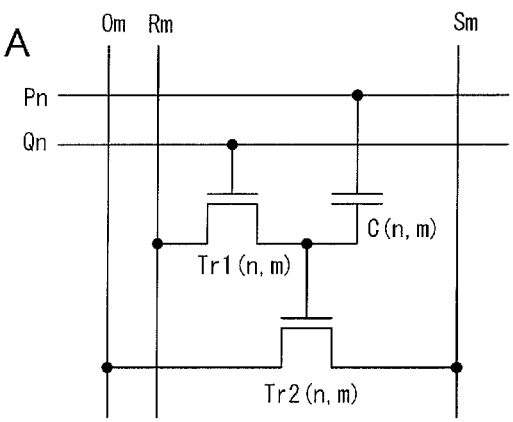
FIGS. 1A and 1B are diagrams illustrating an example of a semiconductor memory device according to an embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Therefore, the present invention is not interpreted as being limited to the description of the embodiments below. Note that in structures of the present invention which are described below, the same portions or portions having similar functions are denoted by the same reference numerals, and detailed description thereof is not repeated.

Further, in the embodiments described below, for easy understanding, timing, width, height, or the like of a pulse is explained to have a fixed value; however, in consideration of the spirit of the present invention, it can be easily understood that the timing of the pulse is not necessarily synchronized or the width or height of the pulse is not necessarily fixed.

[Embodiment 1]

Figure 1B:
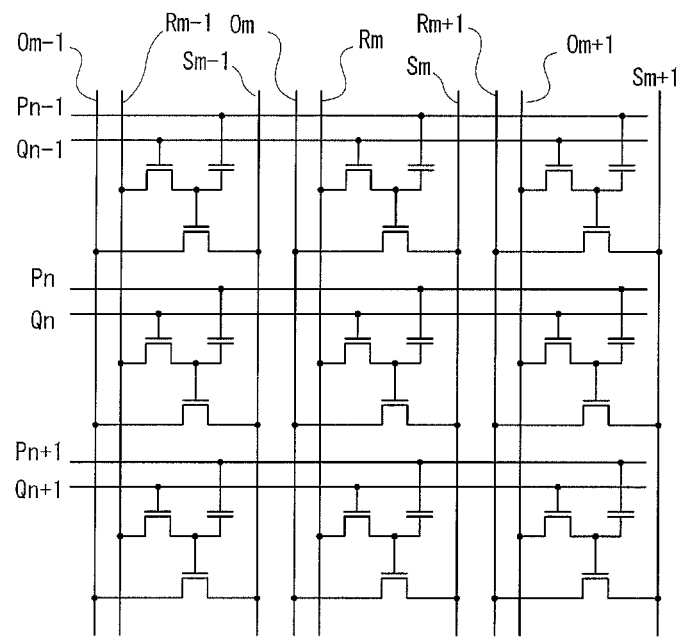

In this embodiment, operation of a semiconductor memory circuit illustrated in FIGS. 1A and 1B is described. Here, both the writing transistor Tr1 and the reading transistor Tr2 are n-channel transistors. First, a writing method is described with reference to FIGS. 2A and 2B. At the time of writing, the reading bit lines ( . . . , Om−1, Om, Om+1, . . . ), the bias lines ( . . . , Sm−1, Sm, Sm+1, . . . ), and the reading word lines Pn−1, Pn, Pn+1, . . . ) are held at constant potential. Although potential may be different depending on the kind of a wiring, the potential of any wiring is set to 0 volt here.

Figure 2A:
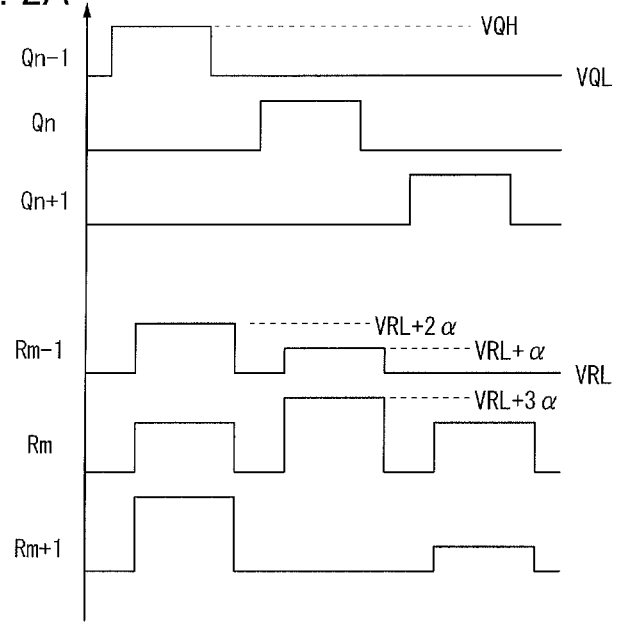
FIGS. 2A and 2B are diagrams illustrating a driving method (writing) of the semiconductor memory device according to an embodiment of the present invention.

In this state, a pulse is sequentially applied to the writing word lines ( . . . , Qn−1, Qn, Qn+1, . . . ) so that the writing transistor is turned on/off. Here, the potential of the writing word line when the pulse is not applied is $V_{QL}$ and potential of the pulse is $V_{QH}$. As illustrated in FIG. 2A, by sequentially applying the pulse in each row, the writing transistor is turned on/off per row. A time for which the pulse continues may be determined in consideration of the characteristics of the writing transistor.

Although periods during which the pulse is applied are prevented from overlapping with each other in the diagram, for example, a period during which a pulse is applied to Qn−1 may partly overlap with a period during which a pulse is applied to Qn. In addition, $V_{QL}$ needs to be lower than or equal to the threshold value of the writing transistor Tr1 and can be set to −2 volts, for example. Further, $V_{QH}$ needs to be higher than or equal to the threshold value of the writing transistor Tr1 and can be set to +2 volts, for example.

At the same time, a signal is applied to the writing bit lines ( . . . , Rm−1, Pm, Rm+1, . . . ). The signal applied to the writing bit lines includes a plurality of pulses and the height of the pulses can be various. Here, the pulses have four levels of height $V_{RL}$, $V_{RL+\alpha}$, $V_{RL+2\alpha}$, and $V_{RL+3\alpha}$ ($\alpha>0$). The pulses are not completely synchronized with the pulses to the writing word lines but application of the pulses to the writing bit lines is preferably started after a predetermined period ($\tau_1$) after application of the pulses to the writing word lines is started.

Further, application of the pulses to the writing bit lines is preferably stopped after a predetermined period ($\tau_2$) after application of the pulses to the writing word lines is stopped. Here, $\tau_1$ and $\tau_2$ may be set so that $\tau_1 < \tau_2$ or $\tau_1 > \tau_2$; however, for design of a circuit, it is preferable that they are set so that $\tau_1 = \tau_2$.

Figure 2B:
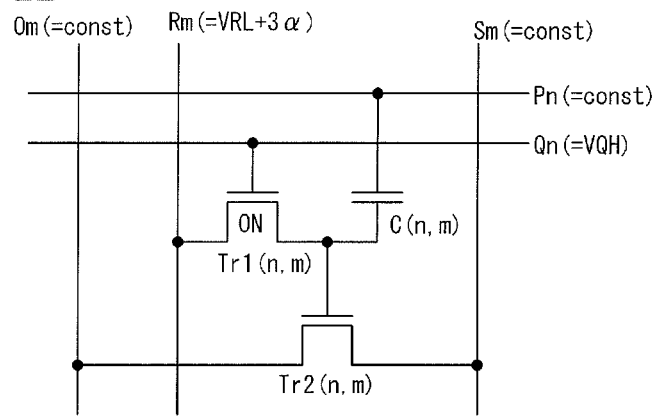

A state of the memory cell in the n-th row and the m-th column is illustrated in FIG. 2B. Here, the potential of the writing word line Qn is $V_{QH}$ and the writing transistor Tr1(n, m) is thus in an on state. Therefore, the drain of the writing transistor Tr1(n,m) (i.e., the gate of the reading transistor Tr2(n,m)) is at the potential $V_{RL+3\alpha}$ of the writing bit line Rm at the time or at potential close to this potential.

In this manner, potential in each memory cell is determined. Based on the potential in each memory cell, the amount of charge generated on the drain side of each of the writing transistors Tr1 is determined. Here, the amount of charge in each of the memory cells is shown in Table 1 when the amount of charge corresponding to the potential $V_{RL}$ is Q0, that corresponding to the potential $V_{RL+\alpha}$ is Q1, that corresponding to the potential $V_{RL+2\alpha}$ is Q2, and that corresponding to the potential $V_{RL+3\alpha}$ is Q3.

TABLE 1

|  | the (m − 1) th column | the m-th column | the (m + 1) th column |
|---|---|---|---|
| the (n − 1) th row | Q2 | Q2 | Q3 |
| the n-th row | Q1 | Q3 | Q0 |
| the (n + 1) th row | Q0 | Q2 | Q1 |

Figure 4A:
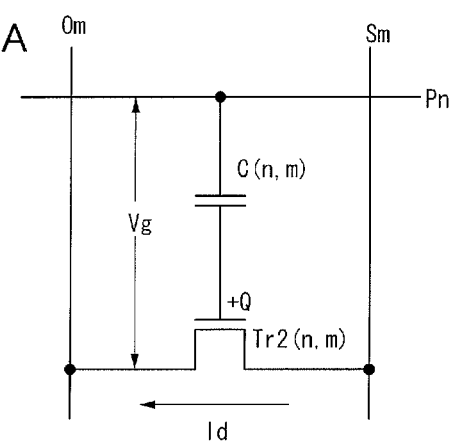
FIGS. 4A and 4B are diagrams illustrating a principle of reading data at a plurality of stages according to an embodiment of the present invention.
Figure 4B:
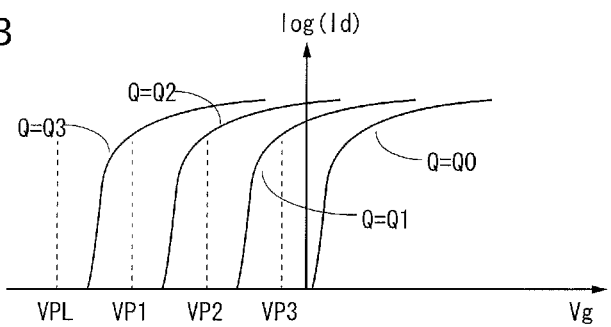

The amount of charge Q0, the amount of charge Q1, the amount of charge Q2, and the amount of charge Q3 correspond to those already described with reference to FIG. 4B. The above charge can be held for an extremely long time (10 hours or longer).

Next, a reading method is described with reference to FIGS. 3A and 3B. As illustrated in FIG. 3B, at the time of reading, constant potential is applied to the writing word lines ( . . . , Qn−1, Qn, Qn+1, . . . ) and the writing bit lines ( . . . , Rm−1, Rm, Rm+1, . . . ). It is necessary to apply potential lower than or equal to the threshold value of the writing transistor to the writing word lines. Although the potential of the writing word line is held at $V_{QL}$ and the potential of the writing bit line is held at $V_{RL}$ here, the lines may be held at another potential.

Further, the bias lines ( . . . , Sm−1, Sm, Sm+1, . . . ) are also held at constant potential $V_{SH}$. The potential $V_{SH}$ can be set to, for example, +1 volt. In addition, a load (a resistor) with an appropriate magnitude is connected to an end of the reading bit lines ( . . . , Om−1, Om, Om+1, . . . ) and an end of the load is held at constant potential (0 V here).

The potential of the reading word lines is held at $V_{PL}$ except when a pulse is applied. Then, as illustrated in FIG. 3A, pulses are sequentially applied to the reading word lines ( . . . , Pn−1, Pn, Pn+1, . . . ). First, the height of the pulse at first is $V_{P1}$ and the pulse is applied to all the rows; then, a pulse at a height of $V_{P2}$ is sequentially applied to the reading word lines. Then, a pulse at a height of $V_{P3}$ is sequentially applied to the reading word lines. In this manner, reading is performed. In the above description, $V_{PL}$, $V_{P1}$, $V_{P2}$, and $V_{P3}$ correspond to those already described with reference to FIG. 4B.

Through the above steps, the reading transistor Tr2 is turned on in some cases by the application of the pulses. For example, as already described with reference to FIG. 4B, it is the reading transistor Tr2 of a memory cell in which the amount of charge is Q3 that is turned on with the pulse at the height of $V_{P1}$, which is the lowest; therefore, which of the memory cells has the amount of charge Q3 can be specified by observing the potential of the reading bit lines ( . . . , Om−1, Om, Om+1, . . . ). This is because when the reading transistor Tr2 is turned on, the potential of the reading bit line becomes close to the potential of the bias line.

Figure 3A:
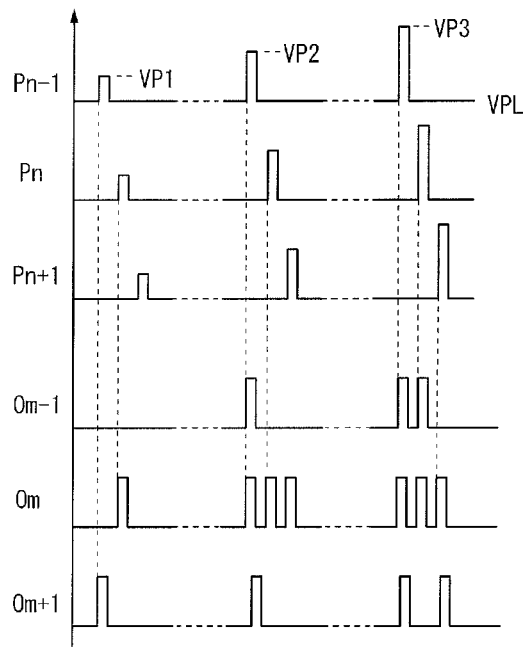
FIGS. 3A and 3B are diagrams illustrating a driving method (reading) of the semiconductor memory device according to an embodiment of the present invention.
Figure 3B:
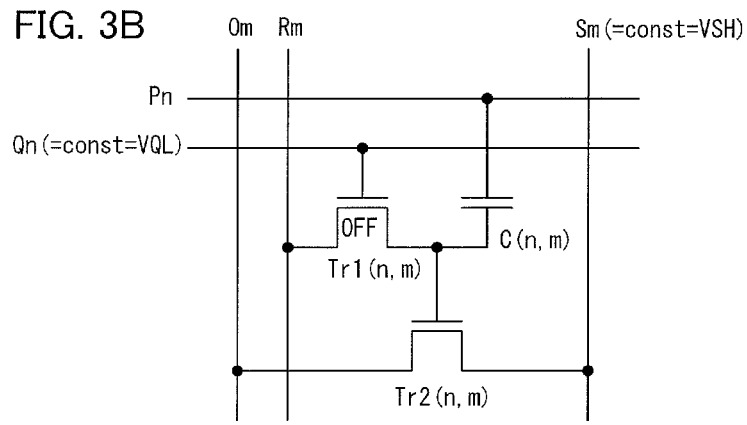

In FIG. 3A, at the time when a pulse is applied to the reading word line Pn−1, the potential of the reading bit line Om+1 is increased (a pulse is generated); at the time when a pulse is applied to the reading word line Pn, the potential of the reading bit line Om is increased. From this fact, it can be specified that the amount of charge in a memory cell in the (n−1)-th row and the (m+1)-th column and the amount of charge in the memory cell in the n-th row and the m-th column are Q3.

Then, in the case where a pulse at the height of $V_{P2}$ is applied to the reading word line, a reading transistor of a memory cell in which the amount of charge is Q3 or Q2 is turned on; thus, in a similar manner, which of the memory cells has the amount of charge Q3 or Q2 can be known. Similarly, also in the case where a pulse at the height of $V_{P3}$ is applied to the reading word line, the potential of the reading bit line is changed depending on the amount of charge.

Reading is thus completed. The number of times of generating a pulse in each memory cell is recorded, whereby data written in the memory cell can be known. For example, in FIG. 3A, in the memory cell in the n-th row and the m-th column, a pulse is generated three times for one reading operation. This is because the charge held is Q3 so that the reading transistor Tr2 is turned on in response to all the pulses which are applied to the reading word line Pn and the potential of the reading bit line Om becomes close to the potential of the bias line Sm.

On the other hand, in a memory cell in the (n+1)-th row and the (m−1)-th column, no pulse is generated. This is because the amount of charge in the memory cell is Q0 that is the smallest and the reading transistor Tr2 is not turned on even with the pulse at the height of $V_{P3}$ that is the highest pulse. Results of adding up the number of pulses generated in each of the memory cells in this manner are shown in Table 2. In this manner, data stored in each memory cell can be read. Although data is sequentially read per row in the above example, it is also possible to read only data in a specific memory cell in a similar manner.

TABLE 2

|  | the (m − 1) th column | the m th column | the (m + 1) th column |
|---|---|---|---|
| the (n − 1) th row | 2 | 2 | 3 |
| the n th row | 1 | 3 | 0 |
| the (n + 1) th row | 0 | 2 | 1 |

[Embodiment 2]

Figure 5A:
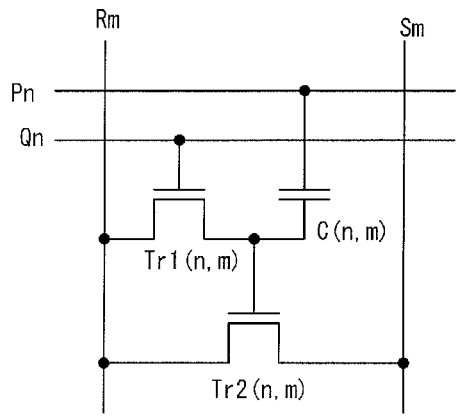
FIGS. 5A and 5B are diagrams illustrating an example of a semiconductor memory device according to an embodiment of the present invention.
Figure 5B:
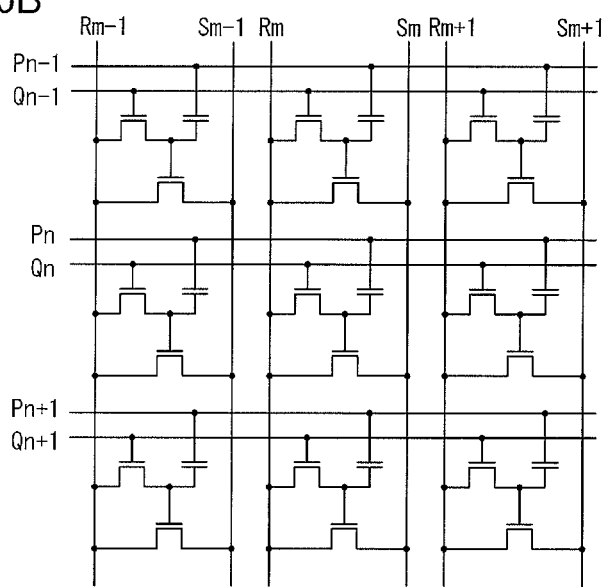

In this embodiment, operation of a semiconductor memory circuit illustrated in FIGS. 5A and 5B is described. Here, both the writing transistor Tr1 and the reading transistor Tr2 are n-channel transistors. In this embodiment, the writing bit line in Embodiment 1 is substituted for the reading bit line. As described above, by employing this structure, the number of wirings of a semiconductor memory device can be smaller than that in Embodiment 1.

A writing method is almost the same as the writing method in Embodiment 1. The bias lines ( . . . , Sm−1, Sm, Sm+1, . . . ) and the reading word lines ( . . . , Pn−1, Pn, Pn+1, . . . ) are held at constant potential. Although potential may be different depending on the kind of a wiring, the potential of any wiring is set to 0 volt here.

Then, a pulse is sequentially applied to the writing word lines ( . . . , Qn−1, Qn, Qn+1, . . . ) as illustrated in FIG. 2A so that the writing transistor is turned on/off. At the same time, a signal is applied to the writing bit lines ( . . . , Rm−1, Rm, Rm+1, . . . ) so that data is written in a memory cell. The amount of the charge held in each memory cell is shown in Table 1, similarly to Embodiment 1.

Figure 6A:
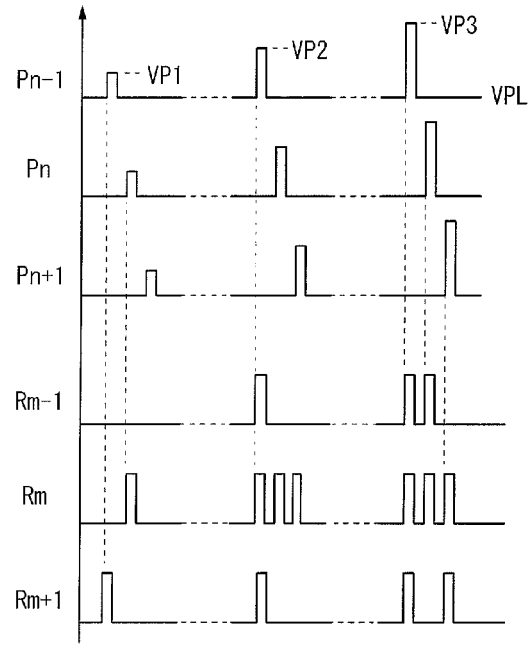
FIGS. 6A and 6B are diagrams illustrating a driving method (reading) of the semiconductor memory device according to an embodiment of the present invention.
Figure 6B:
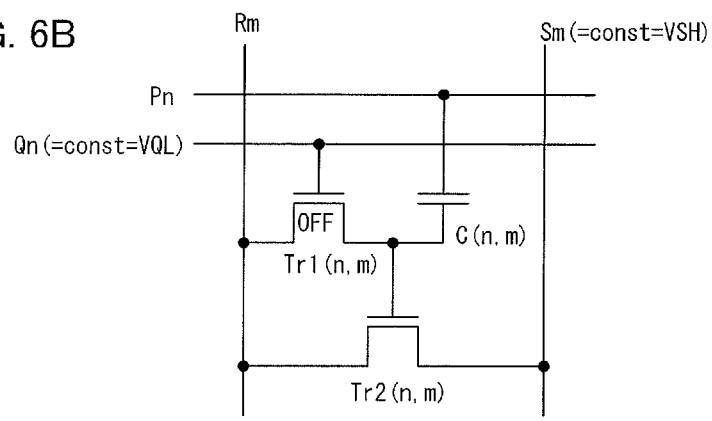

Next, a reading method is described with reference to FIGS. 6A and 6B. In an example below, data is sequentially read per row; it is also possible that only data in a specific memory cell is read in a similar manner. As illustrated in FIG. 6B, at the time of reading, constant potential is applied to the writing word lines ( . . . , Qn−1, Qn, Qn+1, . . . ). It is necessary to apply potential lower than or equal to the threshold value of the writing transistor to the writing word lines. Although the potential of the writing word line is held at $V_{QL}$ here, the line may be held at another potential.

Further, the bias lines ( . . . , Sm−1, Sm, Sm+1, . . . ) are also held at constant potential $V_{SH}$. The potential $V_{SH}$ can be set to, for example, +1 volt. In addition, a load (a resistor) with an appropriate magnitude is connected to an end of the writing bit lines ( . . . , Rm−1, Rm, Rm+1, . . . ) and an end of the load is held at constant potential (0 V here).

The potential of the reading word lines ( . . . , Pn−1, Pn, Pn+1, . . . ) is held at $V_{PL}$ except when a pulse is applied. Then, as illustrated in FIG. 6A, pulses are sequentially applied to the reading word lines ( . . . , Pn−1, Pn, Pn+1, . . . ). First, the height of the pulse at first is $V_{P1}$ and the pulse is applied to all the rows; then, a pulse at a height of $V_{P2}$ is sequentially applied to the reading word lines. Then, a pulse at a height of $V_{P3}$ is sequentially applied to the reading word lines. In this manner, reading is performed. In the above description, $V_{PL}$, $V_{P1}$, $V_{P2}$, and $V_{P3}$ correspond to those already described with reference to FIG. 4B.

At this time, by monitoring the potential of the writing bit line Rm, a state (an on state or an off state) of the reading transistor Tr2 in response to the pulse to the reading word line can be known. Details are the same as those in Embodiment 1 and thus omitted.

[Embodiment 3]

In this embodiment, a shape and a manufacturing method of the semiconductor memory device described in Embodiment 2 are described. In this embodiment, an oxide semiconductor containing zinc and indium is used for the writing transistor Tr1 and a single crystal silicon semiconductor is used for the reading transistor Tr2. Therefore, the writing transistor Tr1 is stacked over the reading transistor Tr2.

That is, an insulated gate transistor using a single crystal silicon semiconductor which is provided over a single crystal silicon substrate is used as the reading transistor Tr2 and a transistor in which an oxide semiconductor is used for a semiconductor layer is formed thereover as the writing transistor Tr1. Note that although an example in which a semiconductor memory device is formed over a single crystal silicon substrate is described in this embodiment, the semiconductor memory device can be provided over another kind of semiconductor substrate or an insulating substrate, alternatively.

Figure 7A:
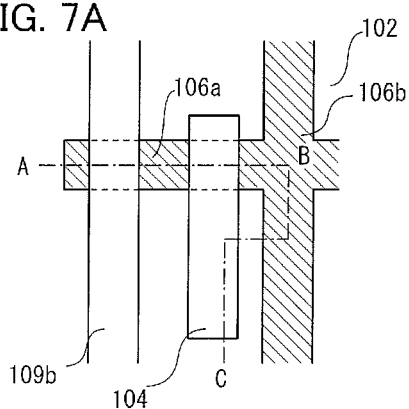
FIGS. 7A to 7C are diagrams illustrating layout and the like of wirings of a semiconductor memory device according to an embodiment of the present invention.
Figure 7B:
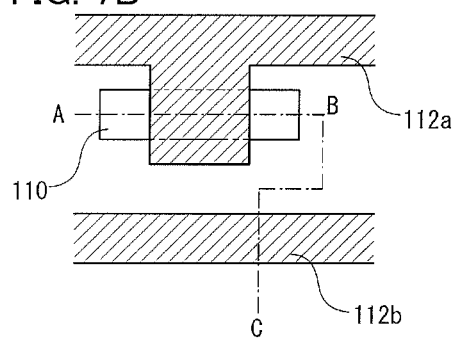
Figure 7C:
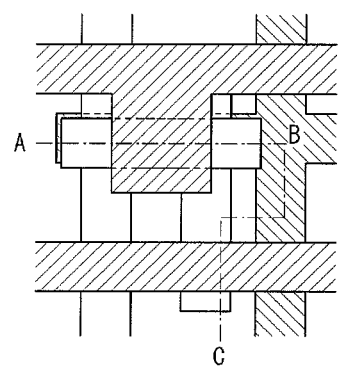

An example of layout of a memory cell of the semiconductor memory device in this embodiment is illustrated in FIGS. 7A to 7C. In FIG. 7A, main wirings, main electrodes, and the like provided over a single crystal silicon substrate are illustrated. An element separation region 102 is formed over the substrate. Further, a wiring which contains a conductive material, doped silicon, or the like is formed in the region other than the element separation region 102 and partly serves as a source 106a and a drain 106b of the reading transistor Tr2. A wiring extended from the drain 106b serves as a bias line. The source 106a and the drain 106b are separated from each other with a gate electrode 104 of the reading transistor Tr2. A writing bit line 109b is connected to the source 106a.

Main wirings, main electrodes, and the like, focusing on the transistor using the oxide semiconductor formed over the circuit of FIG. 7A are illustrated in FIG. 7B. An oxide semiconductor region 110 having an island shape, a writing word line 112a, and a reading word line 112b are formed. Part of the writing word line 112a overlaps with the oxide semiconductor region 110 and serves as a gate electrode of the writing transistor Tr1. The oxide semiconductor region 110 is connected to the gate electrode 104 in the lower layer. Further, a capacitor is formed in a portion where the reading word line 112b overlaps with the gate electrode 104.

A material which forms an ohmic contact with an oxide semiconductor film to be formed later is preferable as a material of the gate electrode 104. An example of such a material is a material whose work function W is almost the same as or smaller than electron affinity φ (an energy gap between the lowest end of the conduction band of the oxide semiconductor and the vacuum level) of the oxide semiconductor. In other words, W<φ+0.3 [electron volt] may be satisfied. For example, titanium, molybdenum, and titanium nitride can be given.

FIG. 7C illustrates a structure where the structure illustrated in FIG. 7A overlaps with the structure illustrated in FIG. 7B. In FIG. 7C, the structures are shifted a little from each other so as to see the overlap. Note that points A, B, and C denote the same positions through FIGS. 7A to 7C. Although a design rule of such elements can be appropriately selected, it is preferable that a channel width of each transistor is greater than or equal to 10 nm and less than or equal to 0.4 μm and a channel length thereof is greater than or equal to 10 nm and less than or equal to 0.4 μm for increase in the integration degree.

Note that although the width of the reading word line 112b in a portion where the reading word line 112b overlaps with the gate electrode 104 (i.e., the capacitor) is almost the same as the width of the writing word line of the writing transistor in FIGS. 7A to 7C, the width of the reading word line 112b in the portion is preferably greater than or equal to 0.5 times and less than or equal to 1.5 times the width of the writing word line of the writing transistor.

Figure 8A:
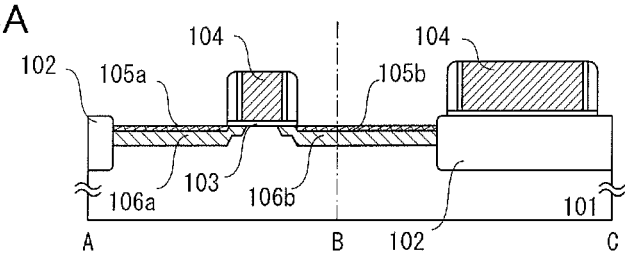
FIGS. 8A to 8D are diagrams illustrating manufacturing steps of the semiconductor memory device according to an embodiment of the present invention.

Hereinafter, a manufacturing method of a semiconductor memory device having the above-described structure is described. FIGS. 8A to 8D and FIGS. 9A to 9D are cross-sectional views taken along a line linking point A to point C through point B in FIGS. 7A to 7C. First, with the use of a known semiconductor manufacturing technique, over a single crystal silicon substrate 101, the following elements are formed as illustrated in FIG. 8A: the element separation region 102; the source 106a and the drain 106b each of which has a doped silicon region (an impurity region); a gate insulating film 103; and the gate electrode 104. Note that although two gate electrodes 104 are illustrated in FIG. 8A, they are one continuous gate electrode as apparent from FIGS. 7A and 7C.

A sidewall may be provided on a side surface of the gate electrode 104. The thickness of the gate insulating film 103 is preferably 10 nm or more so that generation of leakage current is suppressed. In order that gate capacitance be less than the capacitance of a capacitor to be formed later, a material having a relatively low dielectric constant such as silicon oxide is preferably used as a material of the gate insulating film 103.

Over the source 106a and the drain 106b each of which has the impurity region, a silicide region 105a and a silicide region 105b may be provided so that conductivity is increased. In this specification, the source 106a and the drain 106b refer to regions including the silicide regions formed in this manner. In addition, as described above, the drain 106b serves as part of the bias line.

Figure 8B:
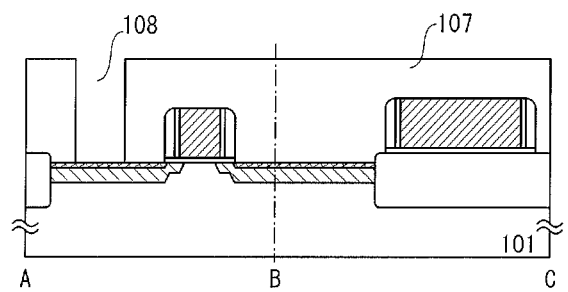

Then, an interlayer insulator 107 is formed. The interlayer insulator 107 may be formed as a single layer or a multilayer and may include a stress liner for causing a distortion in the channel of the transistor. The interlayer insulator 107 is planarized by a chemical mechanical polishing (CMP) method. Then, as illustrated in FIG. 8B, a groove-like opening 108 which reaches the silicide region 105a is formed in the interlayer insulator 107. The depth of the groove-like opening 108 is preferably greater than or equal to 2 times and less than or equal to 4 times the height of the gate electrode 104. Note that the groove-like opening 108 is formed for formation of the writing bit line 109b in FIGS. 7A and 7C.

Figure 8C:
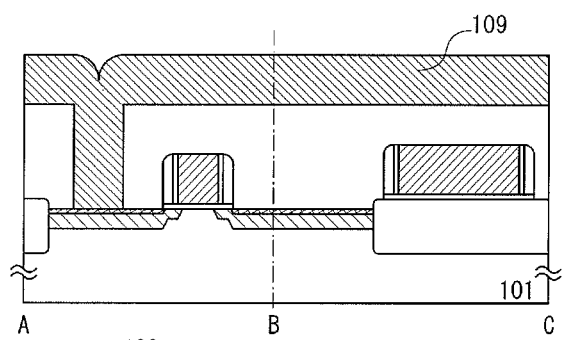

Next, a single-layer or multilayer film 109 containing a conductive material is deposited. As illustrated in FIG. 8C, a thickness and a deposition method which allow the film 109 to completely fill and cover the groove-like opening 108 are selected. As the conductive material, a material which forms an ohmic contact with the oxide semiconductor film to be formed later is preferable, similarly to the case of the gate electrode 104.

Figure 8D:
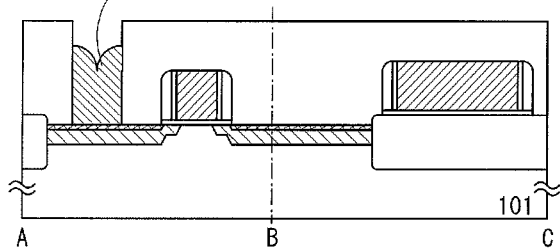

Then, the film 109 containing the conductive material is etched by an anisotropic dry etching method. At this time, as illustrated in FIG. 8D, the etching is performed so that part of the film 109 containing the conductive material which is positioned over the interlayer insulator 107 is thoroughly etched and the film 109 in the groove-like opening 108 remains. The lowest portion of a surface of a film 109a which contains the conductive material and remains in the groove-like opening 108 is positioned higher than the highest portion of the gate electrode 104. When the depth of the groove-like opening 108 is less than 2 times the height of the gate electrode 104, in the above etching step, the film 109a which contains the conductive material and remains in the groove-like opening 108 may be positioned lower than the gate electrode in some cases. This state is not preferred in a later step.

Figure 9A:
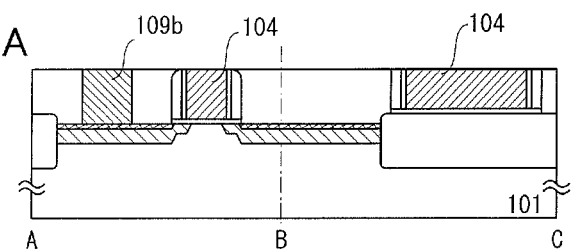
FIGS. 9A to 9D are diagrams illustrating manufacturing steps of the semiconductor memory device according to an embodiment of the present invention.

After that, the interlayer insulator 107, the gate electrode 104, and the film 109a containing the conductive material are planarized and etched by a CMP method, whereby the gate electrode 104 and the writing bit line 109b having conductive surfaces which are almost the same height as illustrated in FIG. 9A are formed. Then, surface treatment using argon plasma is performed in order to reduce hydrogen contained in the vicinity of a surface of the interlayer insulator 107. When the hydrogen concentration in the interlayer insulator 107 is low, the surface treatment is unnecessary.

Then, the oxide semiconductor film having a thickness of 3 nm to 30 nm is formed by a sputtering method. A method other than a sputtering method may be employed as a method for forming the oxide semiconductor film. The oxide semiconductor preferably contains zinc and indium. The hydrogen concentration in the oxide semiconductor film may be lower than $1\times10^{18}$ cm$^3$, preferably lower than $1\times10^{16}$ cm$^{-3}$ in order that the reliability of the semiconductor memory device is increased.

The oxide semiconductor region 110 having an island shape is formed by etching the oxide semiconductor film. The oxide semiconductor region 110 may be subjected to heat treatment so that semiconductor characteristics are improved. Thus, the gate electrode 104 and the oxide semiconductor region 110 are in contact with each other, and the writing bit line 109b and the oxide semiconductor region 110 are in contact with each other.

Figure 9B:
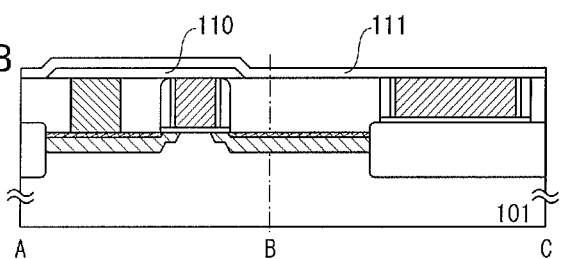

Then, a gate insulating film 111 is formed by a known deposition method such as a sputtering method as illustrated in FIG. 9B. In order that generation of leakage current be reduced, the thickness of the gate insulating film 111 is preferably 10 nm or more and the hydrogen concentration in the gate insulating film is preferably $1\times10^{-19}$ cm$^{-3}$ or less.

Silicon oxide, aluminum oxide, hafnium oxide, lanthanum oxide, aluminum nitride, or the like may be used for the gate insulating film. The gate insulating film 111 is a dielectric of a capacitor which is formed using the gate electrode 104 and the reading word line 112b and is preferably formed using a material with a relative permittivity of 10 or more so that the capacitance of the capacitor is larger than the gate capacitance of the transistor. Heat treatment may be performed after the gate insulating film is formed so as to improve the characteristics of the oxide semiconductor region 110.

Figure 9C:
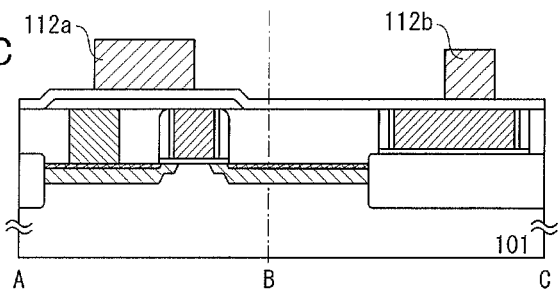

After that, as illustrated in FIG. 9C, the writing word line 112a and the reading word line 112b are formed using a conductive material. Part of the writing word line 112a serves as the gate electrode of the transistor using the oxide semiconductor. As a material of the writing word line 112a and the reading word line 112b, a material whose work function is larger than the electron affinity of the oxide semiconductor by 0.5 electron volts or more is preferable. Tungsten, gold, platinum, p-type silicon and the like can be given as examples.

A basic element structure is completed through the above steps. After that, an interlayer insulator 113 of a single-layer thin film or a multilayer thin film is formed.

Figure 9D:
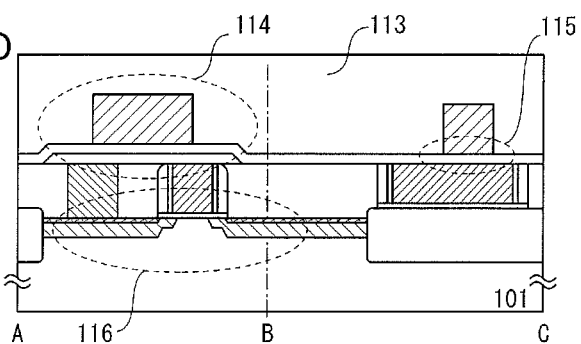

Through the above steps, as illustrated in FIG. 9D, a memory cell of a semiconductor memory device which includes a writing transistor 114, a capacitor 115, and a reading transistor 116 is manufactured.

The capacitor in which the gate insulating film 111 as a dielectric is provided between the gate electrode 104 and the reading word line 112b is formed. The capacitance of the capacitor is determined by the magnitude of overlapped part of the gate electrode 104 with the reading word line 112b; the area of the capacitor is preferably greater than or equal to 100 nm$^2$ and less than or equal to 0.01 μm$^2$.

In light of increase in the integration degree of the semiconductor memory device, the area of the capacitor is preferably less than or equal to 2 times an area S which is determined by the channel width and the channel length of the reading transistor 116, preferably greater than or equal to one-tenth of the area S and less than the area S.

[Embodiment 4]

Figure 10A:
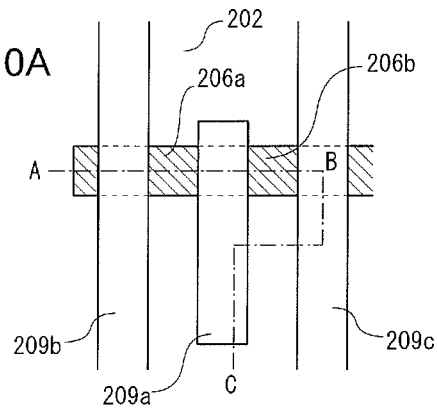
FIGS. 10A to 10C are diagrams illustrating layout and the like of wirings of a semiconductor memory device according to an embodiment of the present invention.
Figure 10B:
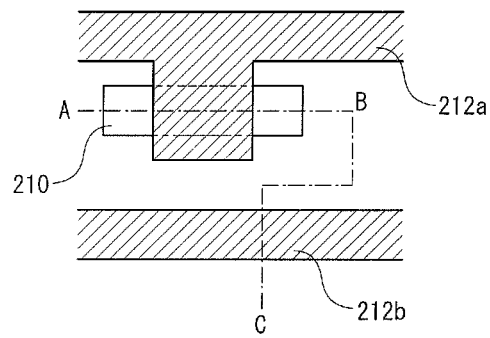
Figure 10C:
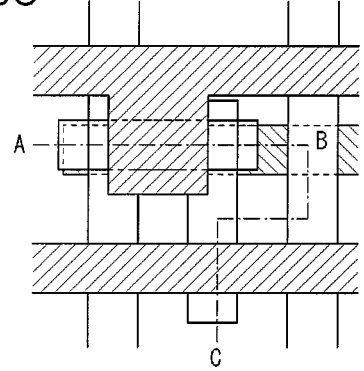

In this embodiment, a manufacturing method different from that described in Embodiment 3 is described. An example of layout of a memory cell of a semiconductor memory device in this embodiment is illustrated in FIGS. 10A to 10C. A basic structure is the same as the structure illustrated in FIGS. 7A to 7C. In FIG. 10A, main wirings, main electrodes, and the like provided over a single crystal silicon substrate are illustrated. An element separation region 202 is formed over the substrate. Further, a region which contains a conductive material, doped silicon, or the like is formed in the region other than the element separation region 202 and partly serves as a source 206a and a drain 206b of the reading transistor Tr2.

The source 206a and the drain 206b are separated from each other with a gate electrode 209a of the reading transistor Tr2. A writing bit line 209b is connected to the source 206a.

A bias line 209c is connected to the drain 206b. The writing bit line 209b and the bias line 209c are embedded in a groove formed in an interlayer insulator.

Main wirings, main electrodes, and the like, focusing on a transistor using an oxide semiconductor formed over the circuit illustrated in FIG. 10A are illustrated in FIG. 10B. An oxide semiconductor region 210 having an island shape, a writing word line 212a, and a reading word line 212b are formed. Part of the writing word line 212a overlaps with the oxide semiconductor region 210 and serves as the gate electrode of the writing transistor Tr1. Further, the oxide semiconductor region 210 is connected to the gate electrode 209a in the lower layer. Further, a capacitor is formed in a portion where the reading word line 212b overlaps with the gate electrode 209a.

FIG. 10C illustrates a structure where the structure illustrated in FIG. 10A overlaps with the structure illustrated in FIG. 10B. In FIG. 10C, the structures are shifted a little from each other so as to see the overlap. Note that points A, B, and C denote the same positions through FIGS. 10A to 10C.

Figure 11A:
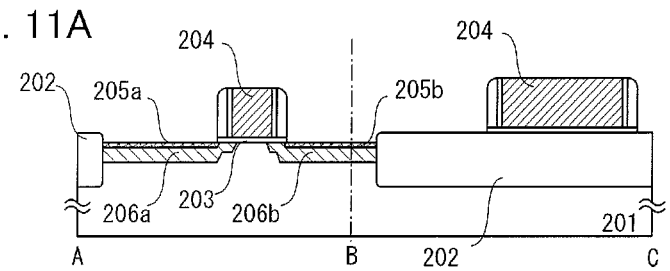
FIGS. 11A to 11D are diagrams illustrating manufacturing steps of the semiconductor memory device according to an embodiment of the present invention.

Hereinafter, the manufacturing method of a semiconductor memory device having the above-described structure is described. FIGS. 11A to 11D and FIGS. 12A to 12D are cross-sectional views taken along a line linking point A to point C through point B in FIGS. 10A to 10C. First, with the use of a known semiconductor manufacturing technique, over a single crystal silicon substrate 201, the following elements are formed as illustrated in FIG. 11A: the element separation region 202; the source 206a and the drain 206b each of which has a doped silicon region (an impurity region); a gate insulating film 203; and a dummy gate 204. Over the source 206a and the drain 206b, a silicide region 205a and a silicide region 205b may be provided so that conductivity is increased. A sidewall may be provided on a side surface of the dummy gate 204. Polycrystalline silicon may be used for the dummy gate 204.

Figure 11B:
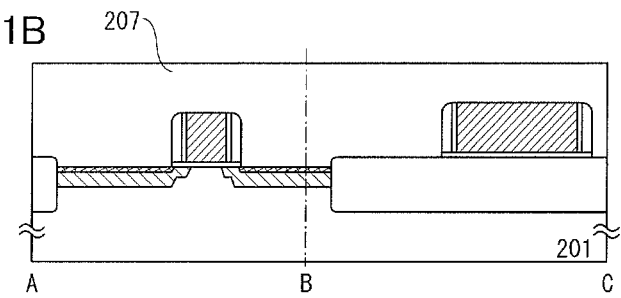

Next, an interlayer insulator 207 is formed as illustrated in FIG. 11B. The interlayer insulator 207 may be formed as a single layer or a multilayer and may include a stress liner for causing a distortion in the channel of the transistor. Planarizing a film in the top layer by a spin coating method facilitates a later step. Here, a planarized silicon oxide film of a single layer which can be obtained by a spin coating method is used as the interlayer insulator 207.

Figure 11C:
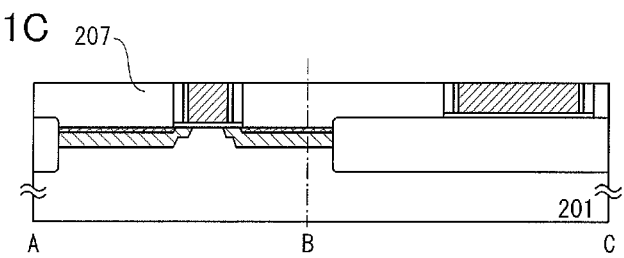

Then, the interlayer insulator 207 is etched by a dry etching method. The dry etching is stopped upon exposure of a top surface of the dummy gate 204; subsequently, planarization and etching are performed by a CMP method. As illustrated in FIG. 11C, the dummy gate 204 is etched to a predetermined extent. The planarization by a CMP method may be stopped around the time when the height of part of the dummy gate 204 which is etched most deeply becomes greater than or equal to half and less than or equal to two thirds of the initial height.

Figure 11D:
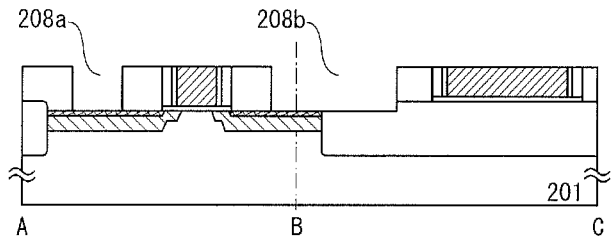

Next, the interlayer insulator 207 is selectively etched, whereby a groove-like opening 208a and a groove-like opening 208b which respectively reach the silicide region 205a and the silicide region 205b are formed as illustrated in FIG. 11D. The groove-like opening 208a and the groove-like opening 208b may be provided in parallel.

Figure 12A:
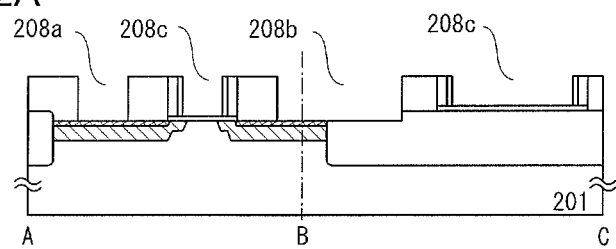
FIGS. 12A to 12D are diagrams illustrating manufacturing steps of the semiconductor memory device according to an embodiment of the present invention.

Next, the dummy gate 204 is selectively etched, whereby an opening 208c is formed as illustrated in FIG. 12A. When polycrystalline silicon is used as a material of the dummy gate 204, TMAH (a tetramethyl ammonium hydroxide) at 2% to 40%, preferably 20% to 25% may be used for the etching.

Figure 12B:
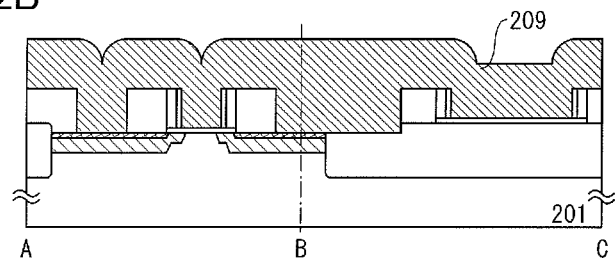

Next, a single-layer or multilayer film 209 containing a conductive material is deposited. As illustrated in FIG. 12B, a thickness and a deposition method which allow the film 209 to completely fill and cover the groove-like openings 208a and 208b and the opening 208c are selected. As the conductive material, the material described in Embodiment 3 as a material of the film 109 containing the conductive material may be used.

Figure 12C:
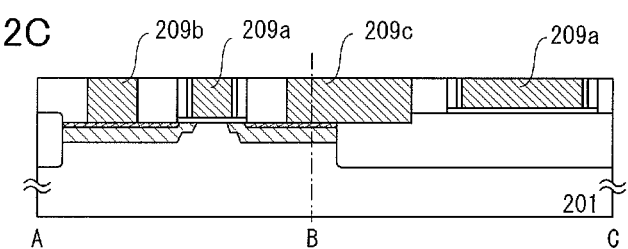

Then, the film 209 containing the conductive material is planarized by etching by a CMP method. This step may be stopped upon exposure of the interlayer insulator 207. Thus, as illustrated in FIG. 12C, the gate electrode 209a, the writing bit line 209b, and the bias line 209c are formed.

Figure 12D:
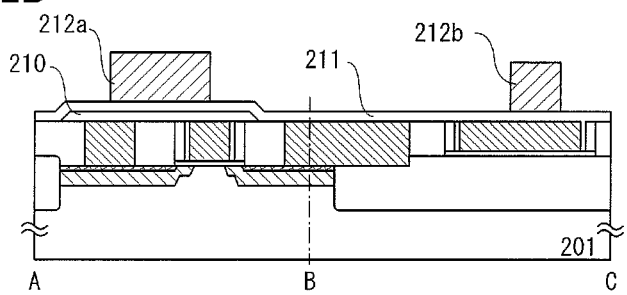

Then, an oxide semiconductor film is formed to a thickness of 3 nm to 30 nm by a sputtering method and etched so that the oxide semiconductor region 210 having an island shape is formed. Further, a gate insulating film 211 is formed by a known deposition method such as a sputtering method. After that, as illustrated in FIG. 12D, the writing word line 212a and the reading word line 212b are formed using a conductive material.

Part of the writing word line 212a serves as the gate electrode of the transistor using the oxide semiconductor. As the material of the writing word line 212a and the reading word line 212b, the material which can be used for the writing word line 112a and the reading word line 112b in Embodiment 3 may be used. The basic element structure of the semiconductor memory device is completed through the above steps.

In Embodiment 3, the impurity region and the silicide region which are formed over the silicon substrate are used as the bias line; in this embodiment, the bias line can be formed using a material with higher conductivity, which is advantageous in high-speed operation of the semiconductor memory device.

[Embodiment 5]

In the semiconductor memory device described in Embodiment 2, the writing bit line in the semiconductor memory device described in Embodiment 1 is substituted for the reading bit line. However, there is a problem of increase in power consumption at the time of writing in this structure, which is caused by reasons below. Hereinafter, the case where the reading transistor is an n-channel reading transistor is described.

For example, positive charge is held in the memory cell in the n-th row and the m-th column and as a result, the reading transistor Tr2($n,m$) of the memory cell is turned on in some cases. The drain of this transistor is connected to the bias line Sm and the source is connected to the writing bit line Rm. The bias line Sm is held at constant potential at the time of writing. In Embodiment 2, the potential is 0 V, as an example.

On the other hand, the potential of the writing bit line Rm is always changed because data is written in another memory cell in the same column, and can be expressed as $V_{RL+x}$ [volt]. The potential $V_{RL+x}$ has a positive value in some cases; at the time of writing, the writing transistor Tr1($n,m$) is in an on state and the potential of the reading bit line is thus the potential of the gate of the reading transistor Tr2($n,m$).

Figure 13A:
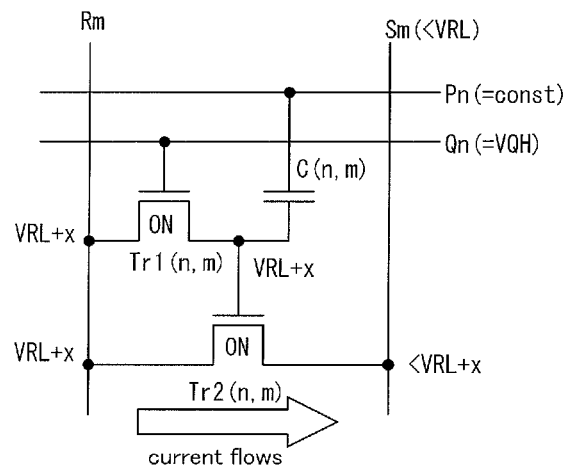
FIGS. 13A and 13B are diagrams illustrating a driving method (writing) of the semiconductor memory device according to an embodiment of the present invention.

In this situation, there is a case where the potential difference between the gate of the reading transistor Tr2($n,m$) and the bias line is larger than or equal to the threshold voltage of the reading transistor Tr2($n,m$). Thus, the reading transistor Tr2($n,m$) is turned on. As a result, as illustrated in FIG. 13A, current flows between the source and the drain of the reading transistor Tr2($n,m$) at the time of writing.

Figure 13B:
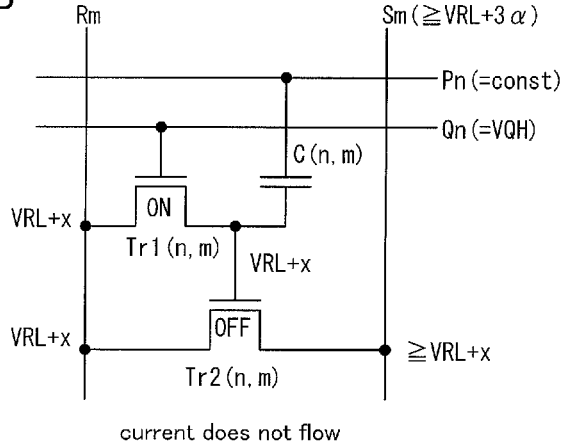

In order that such current be prevented, the potential of the bias line Sm may be set the same as or higher than the highest potential of the writing bit line Rm. In the case where the potential of the bias line Sm is set in the above-described range, at the time of writing (i.e., when the writing transistor Tr1($n,m$) is in an on state), the potential of the gate of the reading transistor Tr2($n,m$) is the same as or lower than the potential of the source or the drain even when the potential of the writing bit line Rm is changed in any way. In other words, the reading transistor Tr2($n,m$) is in an off state. As a result, as illustrated in FIG. 13B, current does not flow between the source and the drain of the reading transistor Tr2($n,m$).

Note that in this case, since gate capacitance $C_2$ of the reading transistor Tr2($n,m$) cannot be utilized for holding data, it is desirable that the capacitance $C_1$ of the capacitor C(n,m) be the same as or larger than the gate capacitance of the reading transistor Tr2($n,m$), preferably greater than or equal to 2 times as large as the gate capacitance of the reading transistor Tr2($n,m$). At the time of reading, since the gate capacitance of the reading transistor Tr2($n,m$) is connected to the capacitor C(n,m) in series, the potential of the gate of the reading transistor Tr2($n,m$) is low as compared with that at the time of writing. The difference in the potential is proportional to $C_1/(C_1+C_2)$. Therefore, when $C_1$ is sufficiently larger than $C_2$, reduction in the potential is small.

Figure 14A:
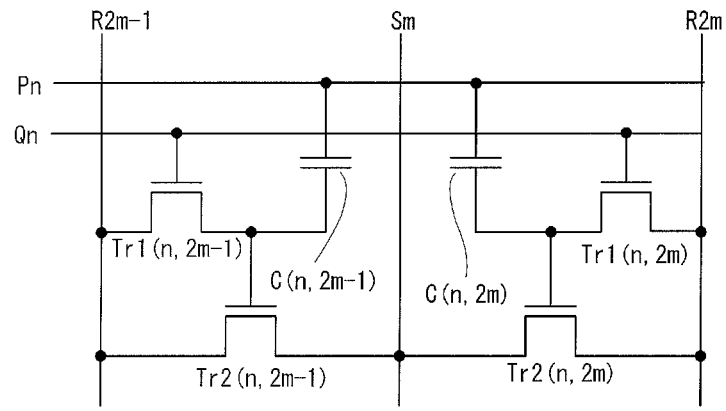
FIGS. 14A and 14B are diagrams illustrating an example of a semiconductor memory device according to an embodiment of the present invention.
Figure 14B:
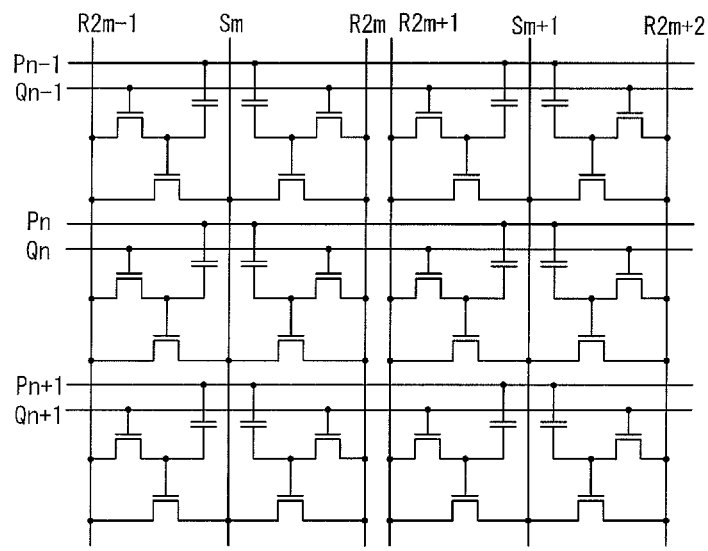
Figure 15:
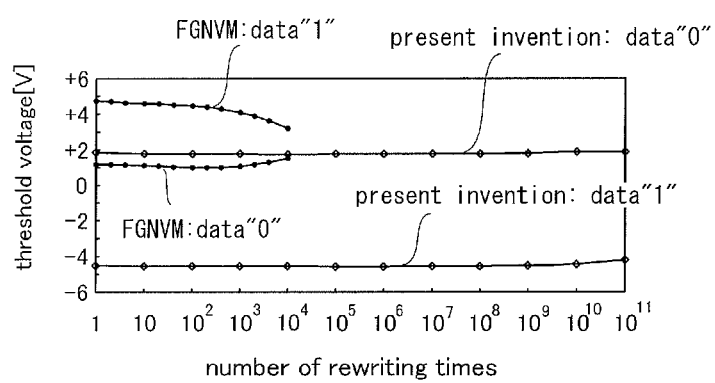
FIG. 15 is a graph showing comparison of the deterioration level (change in the threshold value) due to rewriting between a memory cell according to an embodiment of the present invention and a memory cell of a conventional FGNVM.
Figure 16:
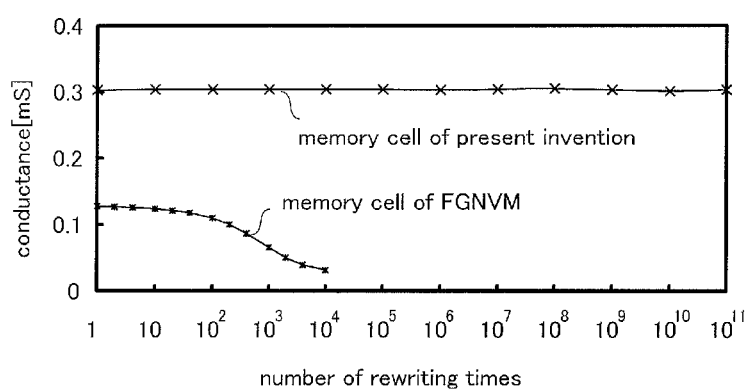
FIG. 16 is a graph showing comparison of the deterioration level (change in conductance) due to rewriting between a memory cell according to an embodiment of the present invention and a memory cell of a conventional FGNVM.

The writing method described above is effective in a semiconductor memory device in which a bias line also serves as a bias line in an adjacent column such as the one illustrated in FIGS. 14A and 14B. This is because the potential of the bias line cannot be the same as that of the writing bit line in the case where the bias line also serves as the bias line in an adjacent column as illustrated in FIGS. 14A and 14B, unlike the case illustrated in FIGS. 5A and 5B where, for example, a bias line is provided in each column and the same potential as that of a writing bit line is applied to the bias line, whereby current between the source and the drain of the reading transistor Tr2 can be prevented.

Note that the reading word line is held at low potential except when writing is performed in a row so that the reading transistor is in an off state regardless of the amount of charge on the drain side of the writing transistor; accordingly, the reading transistor can be in an off state regardless of the potential of the writing bit line.

This application is based on Japanese Patent Application serial no. 2010-034903 filed with Japan Patent Office on Feb. 19, 2010, the entire contents of which are hereby incorporated by reference.

The invention claimed is:

1. A matrix-type semiconductor memory device comprising:
   a first line;
   a second line;
   a third line;
   a fourth line; and
   a plurality of memory cells,
   wherein the first line is parallel to the second line,
   wherein the third line is parallel to the fourth line,
   wherein at least one of the plurality of memory cells includes a first transistor, a second transistor, and a capacitor,
   wherein the first transistor comprises a oxide semiconductor film,
   wherein the oxide semiconductor film comprises indium and zinc,
   wherein a drain of the first transistor is connected to a gate of the second transistor and one electrode of the capacitor,
   wherein a gate of the first transistor is connected to the first line, wherein a source of the first transistor and a source of the second transistor are connected to the third line,
   wherein a drain of the second transistor is connected to the fourth line,
   wherein the other electrode of the capacitor is connected to the second line, and
   wherein the third line is provided between the first line and a substrate.

2. The matrix-type semiconductor memory device according to claim 1, wherein the fourth line comprises the same material as the third line.

3. The matrix-type semiconductor memory device according to claim 1, wherein the gate of the second transistor comprises the same material as the third line.

4. The matrix-type semiconductor memory device according to claim 1, wherein the first line, the second line, the third line, the fourth line and the plurality of memory cells are provided over a semiconductor substrate.

5. The matrix-type semiconductor memory device according to claim 1, wherein the first line is orthogonal to the third line.

6. The matrix-type semiconductor memory device according to claim 1, wherein a width of the second line is greater than or equal to 0.5 times and less than or equal to 1.5 times a width of the first line.

7. A matrix-type semiconductor memory device comprising:
   a first line;
   a second line;
   a third line;
   a fourth line; and
   a plurality of memory cells,
   wherein the first line is parallel to the second line,
   wherein the third line is parallel to the fourth line,
   wherein at least one of the plurality of memory cells includes a first transistor, a second transistor, and a capacitor,
   wherein the first transistor comprises a oxide semiconductor film,
   wherein the oxide semiconductor film comprises indium and zinc,
   wherein a drain of the first transistor is connected to a gate of the second transistor and one electrode of the capacitor,
   wherein a gate of the first transistor is connected to the first line, wherein a source of the first transistor and a source of the second transistor are connected to the third line,
   wherein a drain of the second transistor is connected to the fourth line,
   wherein the other electrode of the capacitor is connected to the second line,
   wherein the third line is provided between the first line and a substrate, and
   wherein the gate of the second transistor is in contact with a semiconductor layer of the first transistor.

8. The matrix-type semiconductor memory device according to claim 7, wherein the fourth line comprises the same material as the third line.

9. The matrix-type semiconductor memory device according to claim 7, wherein the gate of the second transistor comprises the same material as the third line.

10. The matrix-type semiconductor memory device according to claim 7, wherein the first line, the second line, the third line, the fourth line and the plurality of memory cells are provided over a semiconductor substrate.

11. The matrix-type semiconductor memory device according to claim 7, wherein the first line is orthogonal to the third line.

12. The matrix-type semiconductor memory device according to claim 7, wherein a width of the second line is greater than or equal to 0.5 times and less than or equal to 1.5 times a width of the first line.

13. A matrix-type semiconductor memory device comprising:
- a first line;
- a second line;
- a third line;
- a fourth line; and
- a plurality of memory cells, wherein the first line is parallel to the second line, wherein the third line is parallel to the fourth line, wherein at least one of the plurality of memory cells includes a first transistor, a second transistor, and a capacitor, wherein a drain of the first transistor is connected to a gate of the second transistor and one electrode of the capacitor, wherein the first transistor comprises a oxide semiconductor film, wherein the oxide semiconductor film comprises indium and zinc, wherein a gate of the first transistor is connected to the first line, wherein a source of the first transistor and a source of the second transistor are connected to the third line, wherein a drain of the second transistor is connected to the fourth line, wherein the other electrode of the capacitor is connected to the second line, wherein the third line is provided between the first line and a substrate, and wherein the third line is in contact with a semiconductor layer of the first transistor.

14. The matrix-type semiconductor memory device according to claim 13, wherein the fourth line comprises the same material as the third line.

15. The matrix-type semiconductor memory device according to claim 13, wherein the gate of the second transistor comprises the same material as the third line.

16. The matrix-type semiconductor memory device according to claim 13, wherein the first line, the second line, the third line, the fourth line and the plurality of memory cells are provided over a semiconductor substrate.

17. The matrix-type semiconductor memory device according to claim 13, wherein the first line is orthogonal to the third line.

18. The matrix-type semiconductor memory device according to claim 13, wherein a width of the second line is greater than or equal to 0.5 times and less than or equal to 1.5 times a width of the first line.

19. A matrix-type semiconductor memory device comprising:
- a first line;
- a second line;
- a third line;
- a fourth line; and
- a plurality of memory cells, wherein the first line is parallel to the second line, wherein the third line is parallel to the fourth line, wherein at least one of the plurality of memory cells includes a first transistor, a second transistor, and a capacitor, wherein a drain of the first transistor is connected to a gate of the second transistor and one electrode of the capacitor, wherein the first transistor comprises a oxide semiconductor film, wherein the oxide semiconductor film comprises indium and zinc, wherein a gate of the first transistor is connected to the first line, wherein a source of the first transistor and a source of the second transistor are connected to the third line, wherein a drain of the second transistor is connected to the fourth line, wherein the other electrode of the capacitor is connected to the second line, wherein the third line is provided between the first line and a substrate, wherein the gate of the second transistor is in contact with a semiconductor layer of the first transistor, and wherein the third line is in contact with the semiconductor layer of the first transistor.

20. The matrix-type semiconductor memory device according to claim 19, wherein the fourth line comprises the same material as the third line.

21. The matrix-type semiconductor memory device according to claim 19, wherein the gate of the second transistor comprises the same material as the third line.

22. The matrix-type semiconductor memory device according to claim 19, wherein the first line, the second line, the third line, the fourth line and the plurality of memory cells are provided over a semiconductor substrate.

23. The matrix-type semiconductor memory device according to claim 19, wherein the first line is orthogonal to the third line.

24. The matrix-type semiconductor memory device according to claim 19, wherein a width of the second line is greater than or equal to 0.5 times and less than or equal to 1.5 times a width of the first line.

25. A method for driving a matrix-type semiconductor memory device including a first line, a second line, a third line, a fourth line, and a plurality of memory cells, wherein the first line is parallel to the second line, wherein the third line is parallel to the fourth line, wherein at least one of the plurality of memory cells includes a first transistor, a second transistor, and a capacitor, wherein a drain of the first transistor is connected to a gate of the second transistor and one electrode of the capacitor, wherein a gate of the first transistor is connected to the first line, wherein a source of the first transistor and a source of the second transistor are connected to the third line, wherein a drain of the second transistor is connected to the fourth line, wherein the other electrode of the capacitor is connected to the second line, and wherein the third line is provided between the first line and a substrate.

wherein potential of the fourth line is higher than potential of the third line at the time of writing data.

* * * * *